United States Patent [19]

Gotou et al.

[11] Patent Number: 4,662,973
[45] Date of Patent: May 5, 1987

[54] CONTINUOUS PROCESS FOR PREPARING REINFORCED RESIN LAMINATES

[75] Inventors: Masana Gotou, Miki; Minoru Isshiki, Kobe; Shoji Uozumi, Kobe; Masayuki Ohizumi, Kobe; Yasuo Fushiki, Takatsukishi, all of Japan

[73] Assignee: Kanegufuchi Kagaku Kogyo Kabushiki Kaisha, Osaka, Japan

[21] Appl. No.: 451,405

[22] Filed: Dec. 20, 1982

Related U.S. Application Data

[63] Continuation-in-part of Ser. No. 132,500, Mar. 21, 1980, abandoned.

[30] Foreign Application Priority Data

Mar. 26, 1979 [JP] Japan .................................. 54-35805

[51] Int. Cl.⁴ ............................. C09J 5/02; C09J 7/00
[52] U.S. Cl. .................... 156/307.4; 29/829; 156/247; 156/313; 156/314; 156/315; 156/323; 156/324; 156/332; 174/68.5; 428/246; 428/251; 428/901
[58] Field of Search .............. 156/247, 323, 313, 324, 156/314, 330, 315, 332, 164, 307.4; 428/246, 901, 251; 29/829; 174/68.5; 260/453 RZ

[56] References Cited

U.S. PATENT DOCUMENTS

| | | | |
|---|---|---|---|
| 2,517,698 | 8/1950 | Muskat | 156/247 |
| 2,537,311 | 1/1951 | Lyon | 156/323 |
| 2,596,162 | 5/1952 | Muskat | 156/247 |
| 2,632,744 | 3/1953 | Howald | 156/315 |
| 2,750,320 | 6/1956 | Latham | 156/323 |
| 2,985,615 | 5/1961 | Tunteler | 156/332 |
| 3,236,714 | 2/1966 | Traut | 156/323 |
| 3,508,983 | 4/1970 | Origer et al. | 428/901 |
| 3,676,252 | 7/1972 | Allington | 156/330 |
| 3,810,816 | 5/1974 | Zachariades | 156/247 |
| 3,902,951 | 9/1975 | Doi et al. | 156/332 |
| 4,012,267 | 3/1977 | Klein | 156/324 |
| 4,075,236 | 2/1978 | Wagle et al. | 260/453 RZ |

Primary Examiner—John J. Gallagher
Attorney, Agent, or Firm—Haight and Associates

[57] ABSTRACT

A continuous process for producing reinforced resin laminates is disclosed. A plurality of fibrous substrate is continuously and sequentially subjected to the steps of (a) impregnating with resin, (b) laminating into a unitary member, (c) sandwiching between a pair of covering sheet, at least one of which is a cladding metal foil, and (d) curing the resin while supporting between said covering sheets without applying pressure on the laminate surface.

30 Claims, 2 Drawing Figures

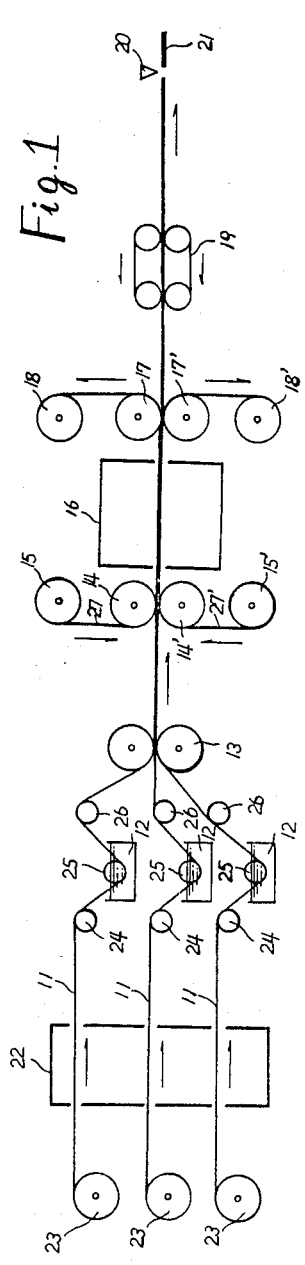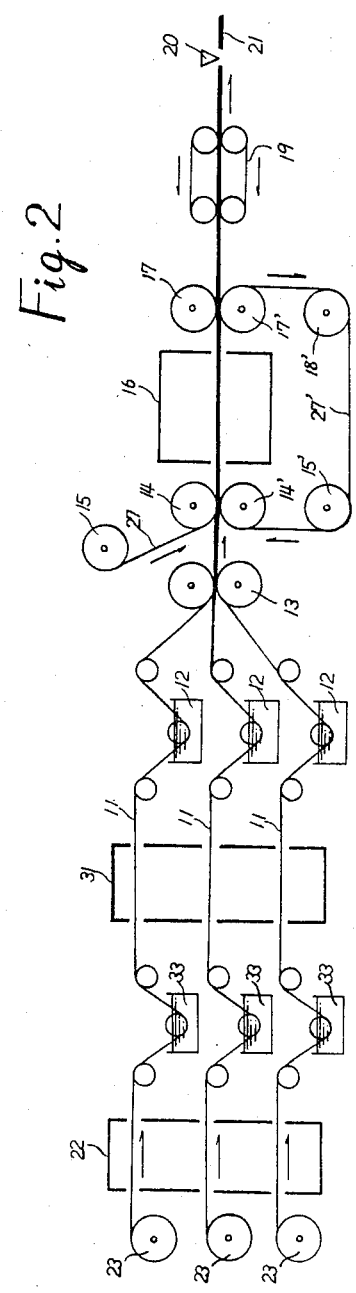

CONTINUOUS PROCESS FOR PREPARING REINFORCED RESIN LAMINATES

CROSS-REFERENCE TO RELATED APPLICATION

This application is a continuation-in-part of our co-pending application Ser. No. 06/132,500, filed Mar. 21, 1980, and now abandoned.

BACKGROUND OF THE INVENTION

This invention relates to a method for continuously producing reinforced laminates.

Resin-impregnated reinforced laminates such as clad or unclad laminates of electrical grade have been produced by impregnating fibrous reinforcing sheets with a resin solution, drying and partially curing the impregnated material to form so-called "prepreg", stacking the prepreg to a desired thickness and heating the stack under pressure. This process is carried out batchwise and requires unduly large amounts of labor and skill. Attempts have been made to effect the foregoing steps on continuous basis. Difficulty is present, however, in continuously carring out the final curing step in which plies of prepregs are heated under pressure for a length of time. Great pressure is required in this step to finish to a product having a uniform thickness and smooth surface characteristics.

U.S. Pat. No. 2,596,162 to Muskat describes a technique for the continuous production of a fiber-reinforced resin laminate wherein a stack of impregnated substrate sheets is sandwiched between a pair of non-porous flexible sheets (such as cellophane) and cured as such without the application of pressure thereto. However, this references does not teach the use of a cladding metal foil, which becomes an integral part of the finished laminate, as a covering sheet for the uncured laminate during the curing process. Furthermore, in the process of the reference, the polymerization of the resin component used for impregnation of the substrate is discontinued or interrupted before the final polymer is obtained, preferably while the polymer is tacky or adhesive. While a metal foil is incidentally mentioned as a suitable cover sheet, the reference specifically teaches that said materials are normally non-adherent to the polymer so that they may be removed readily after the resin impregnated sheets are cured.

As a result of interrupting polymerization when an adhesive state is reached, the semi-cured laminate prepared by this prior art method is then cut into sections which in turn are fully cured while holding them in the desired final shape. Such a process is not suitable for the production of metal clad laminates, wherein processing while the resin is in a semi-solid state must be avoided because the metal foil is not secured in position.

U.S. Pat. No. 3,810,816 to Zachariades shows a technique whereby the metal foil becomes an integral part of the finished laminate. The foil used in this prior art technique serves not only as a cover sheet, but also as a means for applying substantial pressure on the impregnated substrate. In the prior art method, the foil is naturally subjected to bending forces at various points after it has been applied on the impregnated substrate; this is only possible when the finished laminate is sufficiently flexible and thin. When a bending force is applied on a laminate in a direction perpendicular to the plane thereof, the outermost surface is pulled circumferentially, while the inner surface is similarly compressed. The greater of the thickness of the laminate, the greater the displacement of the surface area thereon. Metal clad, rigid laminates are apparently unable to accommodate such repeated bendings.

SUMMARY OF THE INVENTION

According to the present invention metal clad laminates may be produced in truly continuous manner without applying pressure in the curing step of the laminate. This enables great increase in productivity and thus greatly reduces production cost.

The present invention provides a continuous process for preparing flat, rigid, reinforced resin laminate printed circuit board stock material comprising the steps of impregnating a plurality of fibrous substrate sheets with a liquid themosetting resin composition free of volatile components and capable of curing without generating a volatile byproduct; continuously combining a plurality of the resultant impregnated substrates into a continuous, unitary, multiple ply uncured laminate sheet; continuously sandwiching the uncured laminate sheet between a pair of continuous covering sheets, at least one of which is a cladding metal foil capable of adhering to the surface of the uncured laminate to form a continuous flat sandwich; and continuously curing the resultant sandwich to form a continuous sheet of printed circuit board stock material; the improvement which comprises:

(a) throughly impregnating the substrate sheets with resin by continuously contacting the sheets individually and separately with excess resin;

(b) continuously forming the resin-impregnated substrate sheets and cover sheets into a sandwich of a desired thickness while the resin is uncured; and (c) continuously curing the uncured sandwich in the absence of external compressive force thereon perpendicular to the plane of the sandwich to form a continuous sheet of the printed circuit board stock material having uniform thickness, electrical, dielectric, and heat resistant properties along its length.

BRIEF DESCRIPTION OF THE DRAWINGS

The present invention may be fully understood by the following description in which reference is made to the accompanying drawings. In the drawings, FIG. 1 is a schematic view showing one embodiment of the invention, and FIG. 2 is a similar view showing another embodiment of this invention.

DETAILED DESCRIPTION OF THE INVENTION

In FIG. 1, reinforcing fibrous substrate sheets 11 are stored on rolls 23 and unwound from the rolls. Each sheet 11 then passes separately through a drying zone 22 and through resin bath 12 where the substrate is impregnated with liquid resin. Idler rollers 24, 25, 26 guide the substrate into resin bath 12. Plies of the impregnated substrate are then combined into a unitary uncured laminate by passing through a first pair of laminating rollers 13.

It is to be understood that the number of substrate sheets 11 and its associated resin bath 12 etc., may be increased or decreased depending upon the number of plies of the impregnated substrate to build up the desired thickness of the resulting laminates. Then the uncured laminate proceeds into curing chamber 16 where the laminate is continuously cured. Before entering curing chamber 16, the uncured laminate is sandwiched between a pair of covering sheets 27, 27' which support and protect the uncured laminate during the curing step. These covering sheets are fed from supply rolls 15, 15', and brought into contact with the uncured laminate on both sides by a second pair of laminating rollers 14, 14'. Either one of covering sheets 27, 27' or both must be cladding metal foil which becomes a permanent member of the cured laminate. After passing through curing chamber 16, one of covering sheets 27, 27' may be stripped if necessary from the cured laminate by one of rollers 17, 17' and wound on one of take-up rollers 18, 18'. The cured laminate sheet is continuously withdrawn by a pulling mechanism 19 of conventional design downstream of pair of rollers 17, 17' and cut by a cutting device 20 into a finished clad laminate 21 of desired size. In the foregoing process, the uncured laminate will not be pressed positively during the curing step. Only negligible amounts of pressure will be exerted in a direction perpendicular to the plane of the combined sheet of laminate and covering sheets owing to its own gravity. Nevertheless, a uniform thickness and smooth surface characteristics may be obtained by following the teachings of this application set forth below.

The resin compositions to be employed as resin bath 12 have to be free of volatile components such as solvent and capable of curing without generating volatile byproducts such as water or carbon dioxide. They are preferably liquid at room temperature and thermosetting. Examples of preferable resins include unsaturated polyester resins, diallylphthalate resins, vinyl ester resins, epoxy resins and other resins which cure through radical polymerization or addition polymerization. Thermosetting resins which undergo condensation polymerization, such as phenol-formaldehyde and melamine-formaldehyde resins, are not usable.

The unsaturated polyester resins are well-known in the art and may be prepared by reacting a polyhydric alcohol such as ethyleneglycol, propyleneglycol, diethyleneglycol, 1,4-butanediol and 1,5-pentanediol with an unsaturated polycarboxylic acid and a saturated polycarboxylic acid. Usable examples of unsaturated polycarboxylic acid include maleic anhydride and fumaric acid, and examples of saturated polycarboxylic acid include phthalic anhydride, isophthalic acid, terephathalic acid, adipic acid, sebacic acid, and azelaic acid. The condensate has a recurring unit, for example, of the formula:

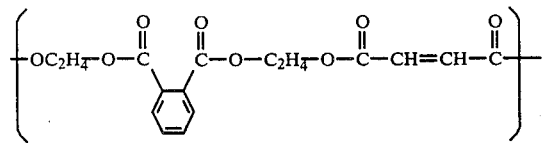

The liquid thermosetting resin composition comprises said unsaturated polyester and nonvolatile crosslinking monomers such as styrene, α-methylstyrene, vinyltoluene, chlorostyrene, divinylbenzene, $C_1$-$C_{10}$ alkyl acrylate, $C_1$-$C_{10}$ alkyl methacrylate, diallylphthalate, and triallylcyanurate. Styrene is most preferable.

The liquid polyester resins may contain a curing catalyst and a curing accelerator. The curing catalyst may be of organic peroxide type, photosensitive type or radiation sensitive type but the organic peroxide type is most preferable. Preferable examples of organic peroxide catalysts include di-t-butylperoxide, 2,5-dimethyl-2,5-di(t-butylperoxy) hexane, acetyl peroxide, isobutyryl peroxide, t-butylperoxy-2-ethylhexanoate, t-butylperoxyacetate, t-butylperoxyisobutyrate, t-butylperoxy-2-ethylhexanoate, 5-butylperoxylaurate, etc. Conventional curing accelators such as cobalt compounds may be used.

The liquid epoxy resins which may be employed for impregnating fibrous substrate in accordance with the present invention include bisphenol A epoxy resins, bisphenol F epoxy resins, epoxy novolac resins and mixtures thereof. The epoxy resins contain a curing agent and optionally a reactive diluent. A variety of conventional curing agents may be used including acid anhdyrides, amines, amide amines, dicyandiamide, imidazole compounds and the like. Acid anhydride curing agents are especially suitable for the purpose of the present invention and include phthalic anhydride, tetrahydrophthalic anhydride, hexahydrophthalic anhydride, methyltetrahydrophthalic anhydride, methylhexahydrophthalic anhydride, and methylendic anhydride. Commercially available curing accelerators such as 2-ethyl-4-methylimidazole, boron trifluoride complex, myristyl-dimethyl-benzylammonium chloride, tertiary amines and salts thereof may be also added.

Liquid diallylphthalate resins which may be used in the present invention are mixtures of diallylphathalate prepolymers and diallylphthalate monomer. Preferably 20 to 35 parts by weight of the prepolymer is mixed with 65 to 80 parts by weight of the monomer.

The liquid resin compositions may contain further conventional additives such as fillers, colorants, fire retardants or the like for imparting specific electrical, mechanical or thermal characteristics to the finished laminates.

A variety of fibrous substrates may be used. Usable substrates include woven or nonwoven fabrics made of glass fiber, asbestos or mixtures thereof, or papers made of kraft pulp or cotton linter pulp, as well as other woven or nonwoven fibrous substrates.

Since almost no molding pressure is applied to the laminate during its curing process, it is important to reduce the content of these substrates to a certain limit prior to the impregnation with the liquid resin. Experiments have shown that this limit is less than 2%, preferably less than 1% when cellulosic paper is used as the substrate.

The impregnation may be effected in any suitable manner such as dipping, coating, doctoring or casting. Preferably the substrate is individually impregnated by pouring the liquid resin onto only upper side of the substrate.

A variety of covering sheets may be used such as release paper, moisture-proof cellophane, polyester film, fluorocarbon (Teflon) film and the like and copper, aluminum, stainless steel, iron, phosphor bronze and the like. They are preferably of 10 to 200 μm thick. When one of coverinq sheets 27, 27' is to be stripped at stripping station 17, 17', it is preferable for the covering sheet to be easily releasable from the laminate or to have a coating of a mold release agent such as silicone.

Examples of metal foils include electrlytic or rolled foils of copper, iron, aluminum and other metals having a thickness from 3 to 200 μm. Copper foils are preferable.

The adhesion of metal foils to the surface of laminate may be improved by applying an adhesive and/or primer such as a diluted solution of a silane coupling agent onto the surface of metal foil. Experiments have shown that coating of 0.01–1% aqueous or ethanolic solution of UCC silane coupling agent A-1100 or A-187 gives satisfactory results.

According to another embodiment of the present invention, a plurality of fibrous substrate may be pre-impregnated for various purposes. This embodiment is shown in FIG. 2 in which like numerals identify like components as FIG. 1. Each of the substrate sheet 11, which has been passed through drying zone 22, is pre-impregnated at station 33, and dried at a second drying zone 31. Thereafter, the sheet 11 is treated in the same way as the previous embodiment. Pre-impregnation station 33 and drying zone 31 may be of similar design as resin-impregnation station 12 and drying zone 22, respectively. In this embodiment, one of covering sheets 27 is a cladding metal foil and the other sheet 27' is an endless belt of covering sheet which circulates over rollers 14',15',17' and 18'.

Pre-impregnation is carried out for various reasons. Non-limiting examples are as follows.

A. Glass fabric may be treated with a silane coupling agent to improve the adhesion of the substrate to resin. Experiments have shown that flexural strength may be increase by 1.5 times by pre-impregnation of glass substrate fabric with vinylalkoxysilane coupling agent prior to the impregnation with unsaturated polyester resins.

B. The substrate may be pre-impregnated with polymerizable monomers or comonomers. For example, resin-impregnation speed may be increased by pre-impregnating a substrate paper with acrylate or methacrylate comonomers.

C. Mechanical and/or electrical characteristics of the resulting laminates may be improved by pre-impregnation the substrate with a thermoplastic material. Experiments have shown that the pre-impregnation of substrate paper with polyethyleneglycol at about 10% by weight of the substrate may increase the impact strength of polyester resin laminate by about two times.

D. A solution of thermosetting resins or prepolymers thereof may be used in the pre-impregnation of substrate material. For example, moisture pick-up may be greatly reduced in the finished laminates by pre-impregnating a substrate paper with an aqueous solution of methylolmelamine to a take-up of about 10% on dry basis and then removing water.

E. Impregnation of the substrate with unsaturated polyester resins may be improved by pre-impregnating the substrate with free unsaturated aliphatic acids such as acrylic acid or methacrylic acid monomer.

F. Moisture pick-up of a hydrophilic substrate material may be retarded by reacting the substrate with a hydrophobic reactant. For example, cellulosic substrate may be acylated with acetic anhydride or other acylating agents.

G. Pot life of liquid resin compositions may be prolonged by impregnating the substrate with curing catalyst etc., and resin itself separately. For example, glass fabric substrate is pre-impregnated with commercially available polyamide resin used for curing epoxy resin, dried and then impregnated with epoxy resin free of said curing component. The pot life of epoxy resin in storage tanks or resin baths may be prolonged in this way.

H. Inorganic fillers may be incorporated onto the substrate by the pre-impregnation of substrate with a slurry of the filler.

The pre-impregnation may be effected with the desired chemicals in the form of a solution, vapor or liquid, followed by drying as the case may be. The take-up amount of pre-impregnation chemicals should not exceed 50% by weight. Excessive take-up amount may retard the impregnation of substrates with resins.

Printed circuit board stock material requires among others a precise thickness tolerance throughout the entire area for printing precise photoresist patterns on the surface of the clad side using an automated printing machine.

Since no molding pressure is applied for bonding the metal foil to the insulating substrate layers in the process of the present invention, the metal foil applied on the substrate layers tends to relax by its thermal expansion. Since the thermal expansion coefficient is different between the foil and the remainder of the laminate, the relaxed foil tends to create wrinkels or undulation on the laminate when the laminate is fully cured and cooled.

For this reason, it is advantageous to apply a tension force to the foil in its plane when it passes the curing zone. Experiments have shown that the magnitude of this tension force preferably ranges from 5 to 300 kg/cm$^2$, preferably from 25 to 150 kg/cm$^2$, more preferably from 25 to 100 kg/cm$^2$. Excessive tension forces will create wrinkles in the longitudinal direction and therefore should be avoided. The tension force may be easily created by providing the supply roll of the metal foil with a suitable brake such as a power brake.

The curing of the sandwich of the green laminate must be continued at least until the resin composition has polymerized into a tack-free, non-adhesive, generally rigid state and the metal foil has been rigidly secured on the resin-impregnated substrate sheets. Experiments have shown that the resin composition in the substrates has a gel content of at least 90%, normally more than 95% by weight. Once this state has been reached, the continuous length of the cured laminate may be cut into sections with ease and the peelable covering sheet, when applied, may be easily removed from one side of the cured laminate.

It is often desirable for the printed circuit board stock material to subject to a further processing. For example, when the laminate is made of an unsaturated polyester resin, the amount of residual cross-linking monomer such as styrene monomer should be as low as possible. If the content of residual monomer is too high, the monomer evolves fine bubbles or nasty odor when the laminate is dipped in a hot solder bath. In order to avoid this problem, it is desirable to subject the cured laminate to a treatment referred to as "post-curing" after cutting into sections of a suitable size by placing the sections in an oven at a temperature of 120° to 200° C. for 1 to 30 minutes. The monomer content may be reduced by this treatment to a practically harmless level, for example to several tens of ppm or less. This post curing or any other processing is preferably carried out in a station separate from the main curing chamber for saving the space required for the installation of a lengthy production line.

The advantages of the present invention over conventional batch processes will be apparent from the foregoing description. It enables substantial increase in productibity and decrease in production cost. Another advantage of the process of this invention is the uniformity of thickness of the laminate. It is possible for the laminate of 5 mm thickness, for example, to decrease the variation within 20–30 μm. The laminate produced by conventional processes usually varies by 70–160 μm in the same thickness. Also, thermal expansion coefficient in the thickness direction may be decreased to 40–60% compared with conventional processes.

The present invention is further illustrated by the following examples in which all parts and percentages are by weight unless otherwise indicated.

EXAMPLE 1

A clad laminate was prepared using an apparatus similar to that shown in FIG. 1 and FIG. 2. The unsaturated polyester composition and the substrate paper used are shown in Table I and Table II, respectively.

TABLE I

| Unsaturated polyester resin | | |
|---|---|---|
| Unsaturated polyester constitution | Maleic acid:isophthalic acid:ethylene glycol = 82:18:100 (in moles) | |
| Styrene monomer content in the resin | 37% | |
| Viscosity | 5 poise, 25° C. | |
| Liquid resin composition | Unsaturated polyester resin | 100 parts |
| | t-Butylperoxy-2-ethyl-hexanoate | 1 part |
| | 6% Cobalt naphthenate | 0.2 parts |
| Properties of cured resin | Flexural modulus | 283 kg/mm$^2$ |
| | Rockwell hardness | 106 |
| | Glass transition point | about 90°C. |

TABLE II

| Substrate paper | |
|---|---|
| Grade | MKP-150, Tomoegawa Paper Co., Ltd. |
| Basis weight | about 150 g/m$^2$ |
| Density of air dried paper | about 0.53 g/cm$^3$ |
| Mean thickness | about 280 μm |

Five sheets of the above substrate paper of 1040 mm width were dried in a drying zone at 100° for 10 minutes. Each substrate was then impregnated with the above liquid resin composition by dipping the paper in a resin bath for 20 minutes. Five sheets of the resin-impregnated paper were combined into a unitary member at a laminating station and sandwiched between a polyester film of 35 μm thickness and 1060 mm width and an electrolytic copper foil (1 ounce/ft$^2$, Fukuda Metallic Foil Co., Ltd., T-7) coated with a silane coupling agent (UCC A-1100) on one side facing the substrate sheets by a pair of laminating rollers. The laminate was fully cured in a curing chamber at 100° C. for 90 minutes without applying pressure in the thickness direction while supporting between said polyester film and copper foil under a tension force in the plane of the foil. The polyester film was stripped from the fully cured laminate by a stripping roller, and wound on a take-up roller. The finished laminate was cut by a cutter to a multiplicity of square sheets of 1020 mm × 1020 mm peripheral size and 1.5 mm thickness. Properties of the finished product are shown in Table IV.

EXAMPLE 2

Example 1 was repeated except that each substrate paper was pre-impregnated with a 10% aqueous solution of methylolmelamine (Nikaresin S-305, Nippon Carbide Co., Ltd.) and dried at 120° for 20 minutes. The resulting copper clad laminate had 1.5 mm thickness and was found to have the properties described in Table IV.

EXAMPLE 3

Similar to Example 1 a copper clad fiberglass reinforced laminate was prepared. Eight sheets of a commercially available fiberglass fabric (Nitto Boseki Co., Ltd., WE 18K-BZ) were used. Each substrate fabric was dried at 100° C. for 10 minutes and then impregnated for 20 minutes with a liquid epoxy resin composition whose formulation is shown in Table III.

TABLE III

| Epoxy resin composition | |
|---|---|
| Epikote 828, Shell Chemicals | 100 parts |
| HN-2,200, Hitachi Kasei Co., Ltd. (Methyltetrahydrophthalic anhydride) | 80 parts |
| N,N—dimethylbenzylamine | 0.5 parts |
| Viscosity 6.5 poise, 25° C. | |

Eight plies of the impregnated substrate fabric were combined into a unitary member and sandwiched between a pair of cladding electrolytic copper foil (Fukuda Metallic Foil Co., Ltd., T-7). The clad laminate was fully cured at 130° C. for 120 minutes and cut to square sheets of 1020 mm × 1020 mm peripheral size and 1.6 mm thickness. The properties of the resulting copper clad laminate are shown in Table IV.

EXAMPLE 4

Example 2 was repeated except that the copper foil coated with UCC A-1100 was further coated on the same side with a mixture of 70 parts of Epikote 828 and 30 parts of Versamid (Henkel Japan Co., Ltd.). The properties of the resulting copper clad laminate of 1.5 mm thickness are shown in Table IV.

TABLE IV

| | | Properties of finished laminates | | | | | |
|---|---|---|---|---|---|---|---|
| Item | Unit | Condition | Ex. 1 | Ex. 2 | Ex. 3 | Ex. 4 | Testing method |
| Solder dip resistance | sec. | C-96/23/65 | 17 | 25 | 60 | 47 | JIS C 6481 |
| | | C-96/55/95 | 3 | 7 | 30 | 20 | |
| Surface resistivity | ohm/cm$^2$ | C-96/23/65 | 3 × 10$^{14}$ | 2 × 10$^{12}$ | 1 × 10$^{13}$ | 2 × 10$^{12}$ | JIS C 6481 |
| | | C-96/55/95 | 5 × 10$^7$ | 2 × 10$^9$ | 1 × 10$^{12}$ | 2 × 10$^9$ | |
| Dielectric constant | | C-96/23/65 | 4.5 | 4.4 | 4.6 | 4.2 | JIS C 6481 |
| | | C-96/23/65 +D-48/50 | 5.8 | 4.8 | 4.9 | 4.5 | at 1 MHz |
| Dielectric loss tangent | | C-96/23/65 | 0.038 | 0.032 | 0.021 | 0.032 | |
| | | C-96/23/65 +D-48/50 | 0.080 | 0.043 | 0.025 | 0.043 | |
| Punchability | | C-90/23/65 | Fair | Excellent | — | Excellent | ASTM |
| Optimal punching temp. | °C. | C-90/23/65 | 100° C. | 60–90° C. | — | 60–90° C. | D-617-44 |

TABLE IV-continued

| | | Properties of finished laminates | | | | | Testing method |
|---|---|---|---|---|---|---|---|
| Item | Unit | Condition | Ex. 1 | Ex. 2 | Ex. 3 | Ex. 4 | |
| Alkali resistance | | 5% NaOH D-1/2/40 | No change | No change | No change | No change | JIS C 6481 |
| Solvent resistance | | Trichlorethylene D-1/30/boiling | No change | No change | No change | No change | |
| Clad peel str. | kg/cm | C-90/23/65 | 1.2 | 1.2 | 1.8 | 1.7 | |
| | | C-90/23/65 +C-96/55/95 | 0.9 | 1.1 | 1.6 | 1.6 | |
| | | 260° C. × 10 sec. after soldg. | 1.1 | 1.1 | 1.7 | 1.7 | |
| Odor upon heating | | 180° C. × 30 min. | Very slight | Very slight | — | Very slight | |

We claim:

1. In a continuous process for preparing flat, rigid, reinforced resin laminate printed circuit board stock material comprising the steps of impregnating a plurality of fibrous substrate sheets with a liquid themosetting resin composition free of volatile components and capable of curing without generating a volatile byproduct; continuously combining a plurality of the resultant impregnated substrates into a continuous, unitary, multiple ply uncured laminate sheet; continuously sandwiching the uncured laminate sheet between a pair of continuous covering sheets, at least one of which is a cladding metal foil capable of adhering to the surface of the uncured laminate to form a continuous flat sandwich; and continuously curing the resultant sandwich to form a continuous sheet of printed circuit board stock material; the improvement which comprises:
   (a) thoroughly impregnating the substrate sheets with resin by continuously contacting the sheets individually and separately with excess resin;
   (b) continuously forming the resin-impregnated substrate sheets and cover sheets into a sandwich of a desired thickness while the resin is uncured; and
   (c) continuously curing the uncured sandwich in the absence of external compressive force thereon perpendicular to the plane of the sandwich to form a continuous sheet of the printed circuit board stock material having uniform thickness, electrical, dielectric, and heat resistant properties along its length.

2. A process according to claim 1, wherein both covering sheets are cladding metal foils.

3. A process according to claim 1, wherein only one of the covering sheets is a cladding metal foil and the other covering sheet is continuously released from the printed circuit board stock material after the curing step.

4. A process according to claim 1, wherein the continuously releasing covering sheet is an endless belt.

5. A process according to claim 1, wherein the cladding metal foil is electrolytic copper foil.

6. A process according to claim 5, wherein the copper foil has been pre-coated with a silane coupling agent.

7. A process according to claim 1, wherein dry substrate sheets are pre-impregnated with an effective amount of up to 50% by weight of a composition selected from the group consisting of:
   (a) a silane coupling agent to improve the adhesion of the substrate to the resin;
   (b) polymerizable monomers or comonomers to increase resin impregnation speed;
   (c) a thermoplastic material to improve mechanical and/or electrical characteristics of the resulting laminate;
   (d) a solution of thermosetting resin or a prepolymer thereof to reduce moisture pick-up in the finished laminate;
   (e) ethylenically unsaturated aliphatic carboxylic acids to improve impregnation of the substrate with unsaturated polyester resin;
   (f) a hydrophobic reactant for the substrate to retard moisture pick-up of a hydrophobic substrate;
   (g) a curing catalyst followed by drying to prolong the pot life of liquid resin; and
   (h) inorganic fillers.

8. A process according to claim 1, wherein the substrate is impregnated by pouring the liquid resin onto only the upper side thereof.

9. A process according to claim 1, wherein the resin composition is capable of heat curing and the uncured sandwich is cured by heating.

10. A process according to claim 1, wherein the fibrous substrate is paper having a moisture content of less than 2%.

11. A process according to claim 10, wherein the paper substrate is continuously dried in a heating step prior to impregnation with the resin.

12. A process according to claim 10, further comprising pre-impregnating the paper substrate with an effective amount of up to 50% by weight of a composition selected from the group consisting of:
   (a) acrylate or methacrylate comonomers to increase resin impregnation speed;
   (b) polyethylene glycol to increase the impact strength of the finished resin laminate;
   (c) a solution of thermosetting resin or a prepolymer thereof to reduce moisture pick-up in the finished laminate;
   (d) a cellulose acylating agent to retard moisture pick-up of a hydrophilic substrate material; and
   (e) inorganic fillers
and drying the pre-impregnated substrate when it is (b), (c), (d), or (e).

13. A process according to claim 10, wherein the substrate is impregnated by pouring the liquid resin onto only the upper side thereof.

14. A process according to claim 10, wherein the resin is an unsaturated polyester resin.

15. A process according to claim 14, wherein the resin composition is capable of heat curing and the uncured sandwich is cured by heating.

16. A process according to claim 15, wherein the polyester resin composition comprises (a) a condensate of a polyhydric alcohol with an unsaturated polycarboxylic acid and a saturated polycarboxylic acid, and (b) an ethylenically unsaturated, non-volatile crosslinking monomer.

17. A process according to claim 16, wherein the crosslinking monomer is styrene.

18. A process according to claim 17, wherein the substrate is five sheets of paper having a weight basis of about 150 g/m$^2$, an air dried density of about 0.53 g/cm$^3$, and a mean thickness of about 280 μm.

19. A process according to claim 18, wherein the resin composition consists essentially of (a) about 100 parts of liquid unsaturated polyester resin containing maleic acid:isophthalic acid:ethylene glycol in a molar ratio of about 82:18:100, a styrene monomer content of about 37%, and a viscosity at 25° C. of about 5 poise; (b) one part t-butylperoxy-2-ethylhexanoate; and (c) 0.2 parts 6% cobalt naphthenate, which is cured to a polyester resin film having a flexural modulus of 283 kg/mm$^2$, a Rockwell hardness of about 106, and a glass transition temperature of about 90° C.

20. A process according to claim 18, further comprising pre-impregnating the substrate with an aqueous solution of methylolmelamine and drying the pre-impregnated substrate.

21. A process according to claim 20, wherein the resin composition consists essentially of (a) about 100 parts of liquid unsaturated polyester resin containing maleic acid:isophthalic acid:ethylene glycol in a molar ratio of about 82:18:100, a styrene monomer content of about 37%, and a viscosity at 25° C. of about 5 poise; (b) one part t-butylperoxy-2-ethylhexanoate; and (c) 0.2 parts 6% cobalt naphthenate, which is cured to a polyester resin film having a flexural modulus of 283 kg/mm$^2$, a Rockwell hardness of about 106, and a glass transition temperature of about 90° C.

22. A process according to claim 1, wherein the fibrous substrate is a glass fabric.

23. A process according to claim 22, further comprising pre-impregnating the glass fabric substrate with an effective amount of up to 50% by weight of a composition selected from the group consisting of:

(a) a silane coupling agent to improve the adhesion of the substrate to the resin;
(b) ethylenically unsaturated aliphatic carboxylic acids to improve impregnation of the substrate with unsaturated polyester resin;
(c) a curing catalyst followed by drying and pre-impregnation with epoxy resin free of the curing catalyst to prolong the pot life of liquid resin; and
(d) inorganic fillers
and drying the pre-impregnated substrate.

24. A process according to claim 22, wherein the substrate is impregnated by pouring the liquid resin onto only the upper side thereof.

25. A process according to claim 22, wherein the resin is an epoxy resin.

26. A process according to claim 25, wherein the resin composition is capable of heat curing and the uncured sandwich is cured by heating.

27. A process according to claim 26, wherein the epoxy resin is selected from the group consisting of Bisphenol A epoxy resins, Bisphenol F epoxy resins, epoxy novoloc resins, and mixtures thereof.

28. A process according to claim 24, wherein the substrate comprises eight plies of fiberglass fabric.

29. A process according to claim 28, wherein the epoxy resin composition consists essentially of 100 parts of a Bisphenol A type epoxy resin, 80 parts of methyl tetrahydrophthalic anhydride, and 0.5 parts of N,N-dimethylbenzylamine having a viscosity at 25° C. of about 6.5 poises, and wherein both sides of the sandwich are coated with an electrolytic copper foil to form the laminate.

30. A process according to claim 1, wherein step (b) is conducted by continuously combining the resin-impregnated substrate sheets into a continuous, unitary, multiple ply uncured laminate sheet by passage through a first pair of laminating rollers and continuously forming the uncured laminate sheet and cover sheets into a sandwich of a desired thickness by passage through a second pair of laminating rollers while the resin is uncured.

* * * * *